United States Patent [19]

Hepp et al.

[11] Patent Number: 5,192,910
[45] Date of Patent: Mar. 9, 1993

[54] TEMPERATURE-CONTROL DEVICE FOR SAMPLES

[75] Inventors: Phillip Hepp, Binningen; Werner H. Tschopp, Aesch/Forch; Martin Rindlisbacher, Zürich; Oskar Schett, Uster, all of Switzerland

[73] Assignee: Spectrospin AG, Switzerland

[21] Appl. No.: 715,107

[22] Filed: Jun. 10, 1991

[30] Foreign Application Priority Data

Jun. 12, 1990 [DE] Fed. Rep. of Germany ....... 4018734

[51] Int. Cl.$^5$ .............................................. G01V 3/00
[52] U.S. Cl. ..................................... 324/315; 324/318
[58] Field of Search .............. 324/300, 307, 309, 315, 324/318, 321

[56] References Cited

U.S. PATENT DOCUMENTS

| | | | |
|---|---|---|---|
| 3,525,928 | 8/1970 | Nagao et al. | 324/315 |
| 3,588,677 | 6/1971 | Kleiman et al. | 324/321 |
| 4,218,892 | 8/1980 | Stephens | 62/514 R |
| 4,266,194 | 5/1981 | Hlavka | 324/315 |
| 4,940,942 | 7/1990 | Bartuska et al. | 324/321 |

FOREIGN PATENT DOCUMENTS

| | | |
|---|---|---|
| 0175789 | 2/1985 | European Pat. Off. |
| 3027891 | 2/1981 | Fed. Rep. of Germany |
| 1-299448 | 12/1989 | Japan |
| 1196820 | 7/1970 | United Kingdom |
| 85/04020 | 9/1985 | World Int. Prop. O. |

OTHER PUBLICATIONS

J. Phys. E: Sci. Instrum., vol. 12, 1979, P. Brüesch and W. Foditsch, "A versatile high- and low-temperature optical cell for reflectivity, transmission and light-scattering experiments", pp. 872 to 874.

Yoshida "Modified Variable Temperature Control Unit for NMR Spectrometers" Rev Sci Instr Bd52 Nr3 Mar. 1981.

Aguilar-Parrilla et al. "Temp. Gradients & Sample Heating in Variable Temp. High Speed Mas NMP Sgec." Jo. Mag. Res. Bd187 Nr3 May 1990.

*Primary Examiner*—Louis Arana
*Attorney, Agent, or Firm*—Walter A. Hackler

[57] ABSTRACT

In a temperature-control device for samples, in particular for NMR spectroscopy, comprising a vessel (20) provided with an opening (19) for receiving a measuring sample (1), an inlet opening (10) for introduction of the fluid, an outlet opening (15) for the outflow of the fluid and a flow channel (18) through which at least a partial flow of the fluid is guided past the sample (1), as direct fluid flow, from the bottom to the top, there is provided at least one by-pass channel (17) which is arranged in such a way that an additional partial fluid flow can be guided past the upper area of the said sample (1) in the form of a by-pass fluid flow (7). This enables also the upper area of the sample (1) to be temperature-controlled in an efficient way so as to minimize the temperature gradient in the sample (1). The temperature-control device may comprise, in the upper area of the sample (1), a heat-exchanger system (14) which concentrates the direct fluid flow (8), after it has been combined with the by-pass fluid flow (8), around the sample (1). One achieves in this manner efficient temperature control of the upper section of the sample by the fluid flow, without any disturbing thermal obstacles.

15 Claims, 5 Drawing Sheets

TEMPERATURE-CONTROL DEVICE FOR SAMPLES

BACKGROUND OF THE INVENTION

The present invention relates to a temperature-control device for samples, in particular for NMR spectroscopy, comprising a vessel provided with an opening for receiving a measuring sample, an inlet opening for introduction of a fluid, an outlet opening for the outflow of the fluid and a flow channel through which at least a partial flow of the fluid is guided past the sample, as direct fluid flow, from the bottom to the top.

A device of this type has been known, for example, from EP-A2-0 175 789.

In examining samples, for example by NMR spectroscopy, but also by optical spectroscopy or infrared spectroscopy, it is frequently required that certain sample substances be measured at different temperatures. During such measurements at different temperatures, the spectra normally vary due to the fact that, on the one hand, the heights and widths and, on the other hand, the resonance frequencies of the spectral lines may be temperature-dependent.

If this temperature-dependence of the spectra is to be determined exactly, it is necessary that a constant temperature distribution be attained over the whole active sample volume. Otherwise, adulterations of the desired effect may occur insofar as different volume elements within the sample exhibit different temperatures and may, consequently, in particular in NMR spectroscopy, produce various lines with displaced resonance points which may superpose and may, thus, lead to distorted lineshapes.

The operation of the known temperature-control devices, above all of those used in NMR spectroscopy but also of those used in optical and infrared spectroscopy, is generally such that a cooled or heated fluid, preferably nitrogen gas, is caused to flow past the surface of a cylindrical sample, from the bottom to the top, in order to bring the sample to the desired temperature.

In order to improve the spectral resolution, it is necessary in most of the cases to rotate the sample. This is effected by placing the upper area of the test tube, which contains the sample material, in the rotor of an air turbine which ensures on the one hand that the test tube is positioned correctly, and on the other hand, that it can be rotated.

However, this way of holding the sample firstly results in the situation that the upper area of the test tube cannot be sealed hermetically and that, consequently, the lower part, which can be sealed hermetically, is preferred for introducing the fluid. This means that, preferably, the fluid flow is guided past the test tube from the bottom to the top.

On the other hand, this way of holding the sample has the consequence that if the sample is heated, its bottom area will be heated to a higher temperature than its upper area as a certain amount of heat is dissipated via the point of contact between the test tube and the air turbine. It is this point of contact which plays an important part in the development of an axial temperature gradient in the test tube. In order to counteract the development of this temperature gradient, it would be desirable to have the fluid flow along the test tube from the top to the bottom; but this is connected with technical difficulties, as has been explained above.

In the case of another known arrangement, improved temperature homogeneity is achieved inside the sample by the fact that the temperature-controlling fluid is guided to the bottom of the sample by sort of a countercurrent process. The fluid flows in this case initially from the top to the bottom along the walls of a glass tube which accommodates the test tube containing the sample. The glass tube is open at its bottom so that the fluid is permitted to enter the space between the glass tube and the sample at this point from the bottom to the top and to flow thereafter along the sample from the bottom to the top, in direct contact with the test tube. If the fluid is to heat up the sample, for example, the glass tube will be heated up in this case to a higher temperature at the top than at the bottom so that, due to the radial heat transmission toward the sample, it contributes towards reducing the temperature drop encountered in the test tube in the direction from the bottom to the top. This effect, which counteracts the temperature gradient is, however, very limited because on the one hand the relatively big mass of the test tube, filled with the sample substance, requires correspondingly important heat quantities in order to change its temperature, and because on the other hand it is very difficult to transmit this relatively important heat quantity in radial direction, the wall thickness of the glass tube as well as the fluid flow between the test tube and the glass tube acting as thermal obstacles. In addition, the countercurrent principle is connected with the further drawback that the fluid flow changes its direction several times, which produces an increased flow resistance and, consequently, higher pressures for a given total flow volume $\phi$ of the fluid.

Figure 1:
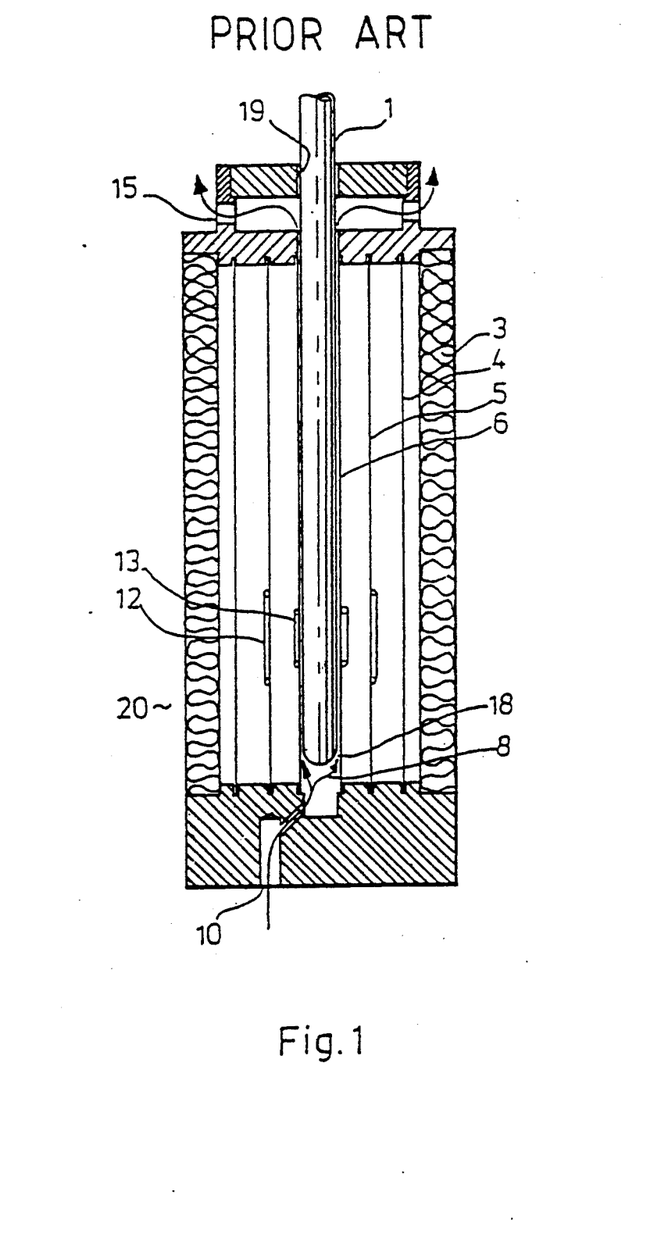
FIG. 1 shows an axial section through a prior art temperature control device for samples.

The conventional temperature-control device for samples illustrated in FIG. 1 shows a standard arrangement of the type used mainly in NMR spectroscopy. A sample 1 has been introduced into a vessel 20 with an outer heat insulation 3 (consisting, for example, of glass wool, expanded plastic, a vacuum, etc.), through an opening 19. A cylindrical carrier tube 6, which encloses the sample 1, carries a first RF coil 13, normally a NMR receiver coil, so that the sample is embraced by the latter. A second cylindrical carrier tube 5 comprising a second RF coil 12, for example a NMR decoupling coil, surrounds the first carrier tube 6 at a radial distance. A third wall 4, for example a cylindrical glass tube, surrounds the second carrier tube 5 at a radial distance and serves as additional thermal insulation for the arrangement.

An inlet opening 10 admits a direct fluid flow 8, normally a gas flow, which is guided against the sample 1 from below and which then enters the flow channel 18 between the sample 1 and the first carrier tube 6, leaving it again at the upper end of the sample 1 through the outlet opening 15.

By feeding the temperature-controlling fluid directly to the test tube, it is possible to attain the desired sample temperature very quickly and with a relatively small fluid flow rate. A serious disadvantage of this arrangement lies, however, in the poor axial homogeneity of the temperature in the sample, because when the sample is to be heated the test tube will get much warmer at the bottom than at the top, and when the sample is to be cooled, it will get much cooler at the bottom than at the top. This situation could of course be improved to some extent by increasing the fluid flow rate. However, since for metrological reasons the spacing between the sample 1 and the first carrier tube 6 must be kept as small as possible in order not to impair unnecessarily the signal-to-noise ratio, any increase of the fluid flow rate would lead to higher pressures in the lower area of the sample 1 and, consequently, to an inadmissible axial displacement of the test tube in upward direction.

Figure 2:
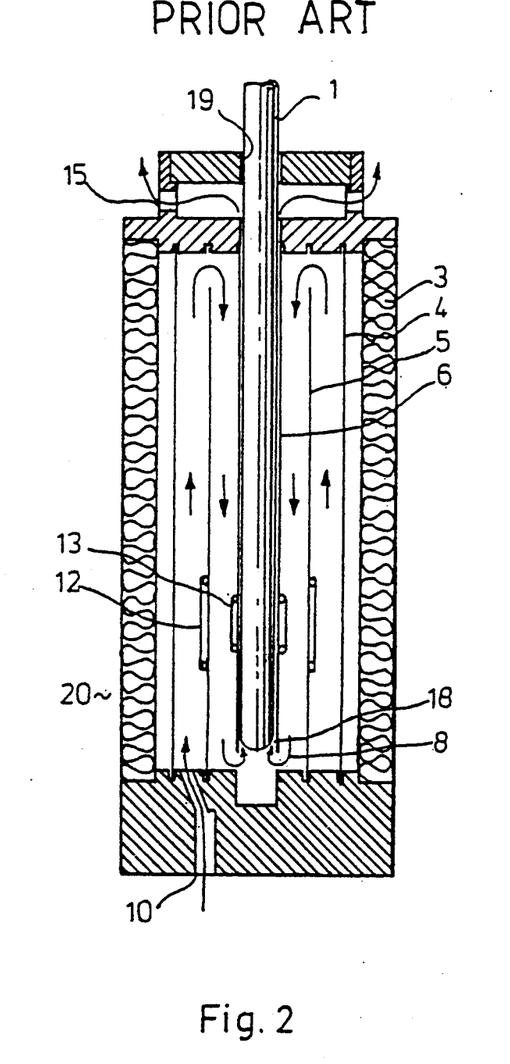
FIG. 2 shows an axial section through a prior art temperature control device for samples, operating according to the counter current principle.

Improved temperature homogeneity in the sample 1 is achieved by the known arrangement illustrated in FIG. 2, which operates according to the countercurrent principle. In this case, the temperature-controlling fluid is admitted to the vessel 20 through the inlet opening 10, flows through the space between the wall 4 and the second carrier tube 5 from the bottom to the top, is then deflected, by the upper cover of the vessel 20, in downward direction and into the space between the first carrier tube 6 and the second carrier tube 5, passes this space from the top to the bottom, and is then once more deflected by the lower cover of the vessel 20 in upward direction and into the flow channel 18 between the sample 1 and the first carrier tube 6. The flow channel 18 is passed by the direct fluid flow from the bottom to the top, whereafter the flow leaves the vessel 20 through the outlet opening 15.

Since in the case of this arrangement, when the sample 1 is to be heated, the direct fluid flow 8, which up to this point has dissipated practically no heat to the environment, heats up the carrier tube 6 directly neighboring the test tube more strongly in its upper area than in its lower area, the axial temperature drop necessarily occurring in the test tube in the case of the arrangement of FIG. 1 can be reduced to some extent by radial heat transmission from the first carrier tube 6 to the upper area of the sample 1. Given the fact, however, that the sample 1 has a much greater heat capacity and thermal conductivity than the other parts of the arrangement passed by the direct fluid flow 8 and that, consequently, a relatively greater amount of heat is required if the temperature gradient in the sample 1 is to be influenced notably, the radial heat transmission from the upper area of the first carrier tube 6 to the upper area of the sample 1 is by far not sufficient to attain axial homogeneity of the temperature in the sample, at least approximately. It is especially the wall thickness of the first carrier tube 6 and the direct fluid flow 8 passing between the first carrier tube 6 and the surface of the test tube which prevents any notable heat transmission. In addition, the direct fluid flow 8 is deflected several times in the case of the arrangement according to FIG. 2, and this results in a higher flow resistance which in turn leads to higher pressures for a given total flow volume $\phi$ of the fluid, a condition which is undesirable as well.

SUMMARY OF THE INVENTION

Starting out from the state of the art, it is the object of the present invention to provide a temperature-control device of the type described above which is capable of achieving a homogeneous temperature curve inside the sample and of reaching the state of thermal equilibrium in the sample within the shortest possible time.

The invention achieves this object by the fact that at least one by-pass channel is provided which is arranged in such a way that an additional partial fluid flow can be guided past the upper area of the sample in the form of a by-pass fluid flow.

With the aid of the by-pass fluid flow, it is rendered possible to heat or cool efficiently especially the upper part of the sample, whereby the temperature gradient inside the sample is reduced. The fact that the by-pass fluid flow is guided along the upper area of the sample directly and without any thermal obstacle enables the desired stable temperature curve to build up quickly inside the sample, the time required until the state of thermal equilibrium is reached being only dependent on the thermal properties of the sample.

According to one embodiment of the invention, a temperature sensor is provided in the lower area of the sample, in the direct fluid flow. This temperature sensor serves for picking up the actual value of the sample temperature, or the temperature of the fluid flowing past the sample at this point.

An additional temperature sensor may be provided in the upper area of the sample, in the by-pass fluid flow, in order to be able to measure the temperature also at this point.

Another embodiment of the invention comprises a device which is capable of detecting the lineshape of the NMR signal from the sample and of indicating the temperature of the sample at an axial position, based on the line width of the NMR signal. This indirect temperature measurement allows on the one hand to do without the temperature sensors, and ensures on the other hand that one actually measures the temperature which is really relevant, namely the temperature of the sample, and not the latter's environmental temperature.

According to a preferred embodiment of the invention, separate supply lines are provided for the direct fluid flow and the by-pass fluid flow to the vessel. This leads to the positive result that the two partial fluid flows are united only in the upper area of the sample. According to a further improvement of this embodiment of the invention, there are provided in addition separate heating and/or cooling means for controlling the temperature of the direct flow and of the by-pass fluid flow, respectively. It is thus possible to supply the two partial fluid flows to the vessel at different temperature levels so as to compensate for the increased heat exchange between the by-pass fluid flow and the wall of the by-pass channel relative to the extremely low heat exchange between the direct sample flow and its environment, from the point of its entry into the vessel up to the point where it gets into contact with the sample.

According to a preferred embodiment of the invention, there is provided at least one valve for controlling the flow rate of the direct fluid flow through the flow channel and/or the flow rate of the by-pass fluid flow through the by-pass channel. Such a valve also enables the partial fluid flows to be adjusted in such a way that different requirements can be met for different measurements. By selecting the valve orifice in a suitable manner it is possible, for example, to adjust the two partial fluid flows for a given total flow $\phi$ in such a way that the smallest possible temperature gradient is obtained over the axial length of the sample, without substantial reduction of the maximum temperature that can be achieved at the sample.

According to a particularly preferred embodiment of the temperature-control device for samples proposed by the invention, there is provided a control device which controls the partial fluid flows through the flow channel and the by-pass channel in such a way that a presettable controlled variable can be kept constant. This control device enables different presettable operating parameters for the measurement to be controlled automatically.

The presettable controlled variable may be the temperature in the lower or upper area of the sample, the temperature difference between the upper and the lower areas of the sample, the total fluid flow $\phi$, the partial flow rate of the direct fluid flow, the partial flow rate of the by-pass fluid flow, or a product of a plurality of these parameters. It is thus possible, for example by controlling the absolute temperature of the sample, to achieve in the sample a stable temperature curve over time. A particularly advantageous solution is obtained when the temperature difference between the upper and the lower areas of the sample is controlled to a minimum. Further, it is also possible to control the fluid flows in such a way that the state of thermal equilibrium is obtained in the sample within the shortest possible time and with a constant flow rate of the fluid.

According to a particularly preferred embodiment of the temperature-control device for samples proposed by the invention, a heat-exchanger system is provided in the upper area of the sample, which system concentrates the direct fluid flow around the sample, after it has been united with the by-pass fluid flow. One achieves in this manner for the upper sample section an effective temperature control by the united fluid flow, without any disturbing thermal obstacles. The heat-exchanger system may display the form of a conduit tube which encloses the upper area of the sample over an axial length of exchange, at a small radial spacing, and which comprises in its lower area one or more baffles which act to deflect the by-pass fluid flow in a direction toward the sample. This brings the fluid flow into intimate contact with the upper area of the sample and ensures in this manner efficient direct cooling or heating of the sample along the axial length of exchange.

According to an advantageous further improvement, the heat-exchanger system has a big axial length of exchange, relative to the axial length of the sample, and small mass, thermal capacity and thermal conductivity relative to the mass, thermal capacity and thermal conductivity of the sample. This keeps the heat losses of the fluid flow caused by the heat dissipation to the heat-exchanger system at a low level and the state of thermal equilibrium of the sample, at the desired temperature, is reached within a particularly short time and with the least possible flow rate.

According to a particularly preferred further improvement of the temperature-control device for samples proposed by the invention, the heat-exchanger system comprises on its surface facing the sample a spiral groove extending axially over the axial length of exchange. This forces the fluid flowing through the space between the heat-exchanger system and the sample to flow around the test tube along a spiral path, whereby the effective axial length of exchange is considerably increased and the time available for the heat exchange between the fluid and the sample is considerably extended. This effect is particularly valuable in the case of non-rotating samples.

The invention will now be described and explained in more detail by way of the example illustrated in the drawing. It is understood that the features that can be derived from the specification and the drawing may be employed in other embodiments of the invention individually or in any combination.

DETAILED DESCRIPTION OF THE PREFERRED EMBODIMENT

Figure 3:
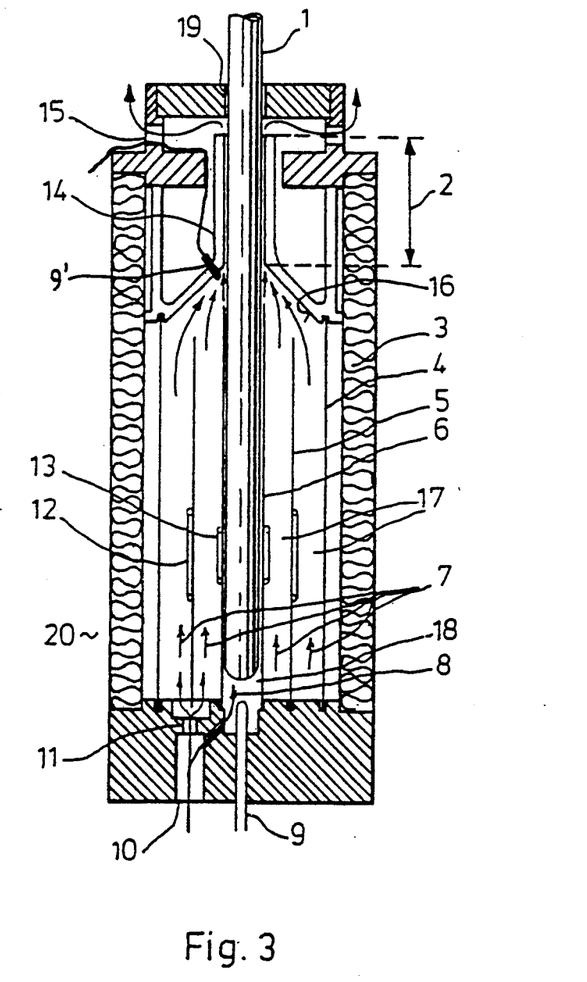
FIG. 3 shows an axial section through a temperature-control device for samples according to the invention.

FIG. 3 illustrates one embodiment of the temperature-control device for samples proposed by the invention which is suited in particular for use in NMR spectroscopy, but also in optical or infrared spectroscopy, for example. The temperature-controlling fluid is introduced through an inlet opening 10 into the vessel 20 where it is divided into two partial fluid flows, namely the direct fluid flow 8, and the by-pass fluid flow 7. The direct fluid flow 8 passes the flow channel 18 between the first carrier tube 6 and the sample 1 from the bottom to the top, just as in the case of the conventional devices, cooling or heating thereby the sample 1, which process gives rise to an axial temperature gradient in the sample, just as in the case of the known devices.

In order to counteract this temperature gradient, the by-pass fluid flow 7, which is guided through one or more by-pass channels 17, in parallel to the direct fluid flow 8, is deflected in the upper area of the arrangement by a baffle 16 —which may be part of a heat-exchanger system 14—toward the upper area of the sample. Given the fact that there are no masses of high thermal capacity at the boundary surfaces of the by-pass channel 17, the by-pass fluid flow 7 still has substantially the same temperature at the point where it contacts the sample 1 which it had at the point of division from the total fluid flow. In case the sample 1 is to be heated, the mixing temperature of the combined fluid flow is much higher at the junction point of the fluid flows in the upper area of the sample 1 than the temperature of the direct fluid flow 8 at that same point, the fluid flow 8 having already dissipated a considerable amount of heat to the sample 1 on its way through the flow channel 18. The flow ratios of the direct fluid flow 8 and the by-pass fluid flow 7, and also the total fluid flow $\phi$ can be influenced by means of a valve 11 which, in the illustrated example, is arranged a short way downstream of the inlet opening 10. In order to achieve a situation where the mixing temperature in the junction area of the two partial fluid flows in the upper area of the sample is as close as possible to the temperature of the fluid entering the vessel 20, it is of advantage if a correspondingly higher flow rate is selected for the by-pass fluid flow 7 than for the direct fluid flow 8.

If the sample 1 is to be cooled, the fluid flow will normally consist of a gas flow produced by vaporizing a liquified cryogenic gas, for example liquid nitrogen or liquid helium, in which case the pressure required for producing a gas flow is built up simultaneously. For heating the sample, the gas flow may be taken directly from a pressure vessel (for example a gas cylinder) and does not have to be produced first by vaporizing the liquid gas. The gas flow is brought into contact with an electrically heated heating coil which brings the gas flow to the desired temperature by means of an electric control system. Thereafter, the gas flow is fed to the vessel 20 and to the sample 1 via a thermally insulated supply line.

In the illustrated example, one can see in the lower area of the sample 1 a temperature sensor 9 which is in contact with the direct fluid flow 8 and which transmits to the electric temperature control device the actual temperature value of the direct fluid flow 8, which at this point corresponds substantially to the temperature of the total fluid flow entering the inlet opening 10. The temperature-control device then compares the actual value with the entered setpoint value and determines from this comparison the current required for the heating coil.

In addition to the temperature sensor 9 illustrated in FIG. 3, there may be provided another temperature sensor—9'—in the by-pass fluid flow 7 in the upper area of the sample 1, for measuring the temperature also at this point. This permits in particular to measure the temperature difference between the upper and the lower areas of the sample 1, which is a measure of the temperature gradient prevailing in the sample 1.

Figure 5:
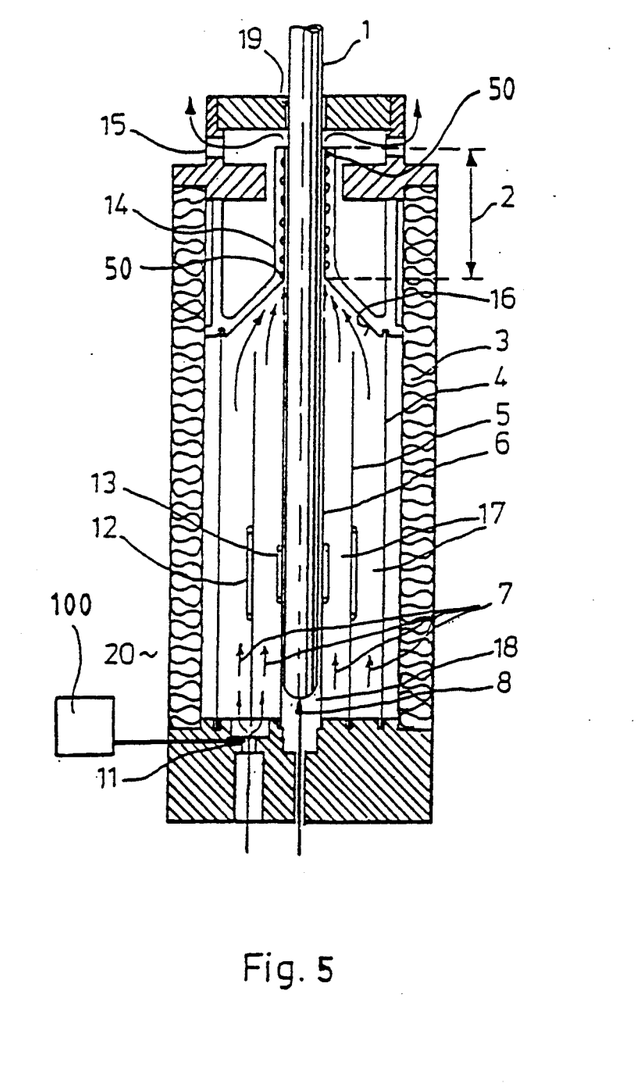
FIG. 5 shows an axial section through a temperature-control device for samples according to the invention.

Instead of measuring the temperature directly by temperature sensors, it is also possible to derive the sample temperature at any axial position indirectly from the lineshape of an NMR signal from the sample as represented in FIG. 5 by a lineshape shape detector 100. This is so because an increased temperature gradient leads to a correspondingly greater line width which may be taken as a measure of temperature. This provides the possibility to derive the relevant temperature from the measuring signal proper, for transmission to the control devices.

Instead of feeding the total fluid flow to the inlet opening 10, as described before, it is also possible, according to an embodiment shown in FIG. 5, to feed the partial fluid flows, i.e. the direct fluid flow 8 and the by-pass fluid flow 7, to the vessel separately, and to combine the two partial fluid flows only in the upper area of the sample 1. This provides the particular advantage that the partial fluid flows may enter the vessel 20 at different temperature levels. If, for example, the sample 1 is to be heated up relative to the environmental temperature, the conditions will be such that, when the total fluid flow is fed into the inlet opening 10, as illustrated in FIG. 3, the temperature of the by-pass fluid flow 7 will be lower at the point of combination with the direct fluid flow 8 in the upper area of the sample 1 than the temperature of the direct fluid flow 8 at the point where it impinges upon the lower area of the sample, because on its long way through the by-pass fluid channel 17 the by-pass fluid flow has dissipated considerably more heat to the surrounding walls than the direct fluid flow 8 on its short way from the inlet opening 10 to the sample. If the two partial fluid flows were given approximately equal volumes, the upper area of the sample 1 would, therefore, always have a lower temperature than the lower area, a condition which could be remedied only by sharply restricting the direct fluid flow 8, or by increasing substantially the partial flow volume of the by-pass fluid flow 7. If, however, the two partial fluid flows can be supplied into the system at different temperature levels, then the by-pass fluid flow 7 simply can be given a correspondingly higher temperature level than the direct fluid flow 8 so as to compensate for the temperature loss of the by-pass fluid flow 7 on its way through the by-pass channel 17. In addition, the temperature control device can be designed in such a way as to enable the temperatures of the two partial fluid flows to be controlled separately.

For other applications of the invention, the vessel 20 may also be a cryostat in which case the outer thermal insulation 3 is a dewar wall and the adjacent inner wall 4 may be designed as an additional thermal insulation, for example in the form of a radiation shield. The temperature-controlling fluids may consist in this case of cryogenic gases, such a nitrogen or helium, which in the case of low-temperature applications may also flow through the cryostat in their liquid state.

Further, there may be provided a control device for controlling, via the valve 11, the partial flows through the flow channel 18 and the by-pass channel 17 in such a way that a presettable controlled variable, for example the temperature in the lower and the upper areas of the sample, the temperature difference between the upper and the lower areas, the total flow $\phi$ of the fluid, the partial flow volumes of the direct fluid flow 8 or of the by-pass fluid flow 7, or a product of a plurality of these parameters, is kept constant. For controlling the fluid flow, this control device may in particular be connected to the before-mentioned electric control means for the temperature of the gas flow.

The heat-exchanger system 14 provided in the upper area of the sample 1 serves the purpose to concentrate the direct fluid flow 8, after it has been combined with the by-pass fluid flow 7, around the sample 1. In the illustrated embodiment, the heat-exchanger system 14 has the shape of a conduit tube enclosing the upper area of the sample 1 over an axial length of exchange 2, at a small radial spacing. In the lower area of the heat-exchanger system 14, one can see an inclined baffle surface 16 which deflects the upwardly flowing by-pass fluid flow 7 toward the sample 1 and which forces it together with the direct fluid flow 7 into the narrow gap between the sample 1 and the upper part of the heat-exchanger system 14. In order to achieve the best possible heat exchange between the combined fluid flow and the sample 1, the length of the tubular upper section of the heat-exchanger system 14 and, thus, the axial length of exchange 2, is chosen as great as possible relative to the axial length of the sample 1. In order to keep the thermal losses of the fluid flow, due to heat dissipation to the heat-exchanger system 14, as small as possible and to reach the state of thermal equilibrium in the sample 1 at the desired temperature in the shortest possible time and with the least possible flow volume of the fluid, the mass, thermal capacity and thermal conductivity of the heatexchanger system 14 should, conveniently, be small relative to the sample 1. Especially in the case of non-rotating samples it is in addition of advantage if the heat-exchanger system 14 comprises a spiral groove 50 on its surface facing the sample 1, which is illustrated in FIG. 5 as a cylindrical surface and which extends in axial direction over the axial length of exchange 2. This increases the effective axial length of exchange, or the time available for the heat exchange between the combined fluid flow and the sample 1 once more quite considerably.

Figure 4A:
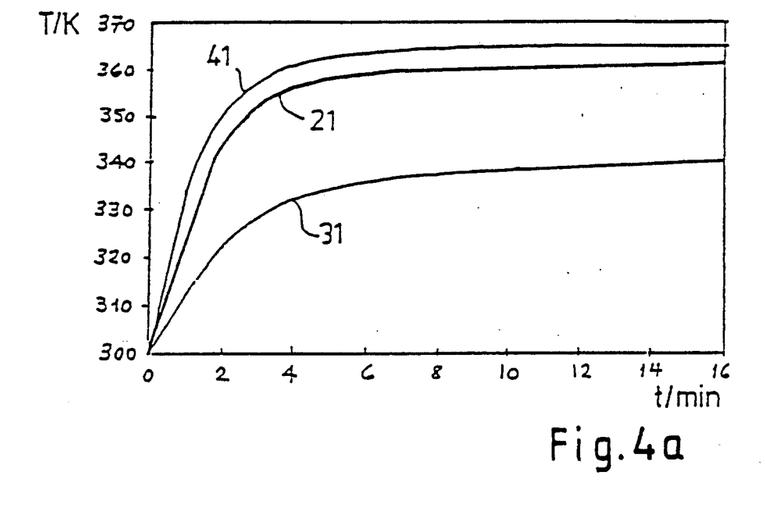
FIG. 4a shows the recorded temperature curves over time for a sample, for the cases of direct temperature control, temperature control using the temperature-control device for samples according to the present invention, and temperature control using a conventional temperature-control device for samples operating according to the countercurrent principle.
Figure 4B:
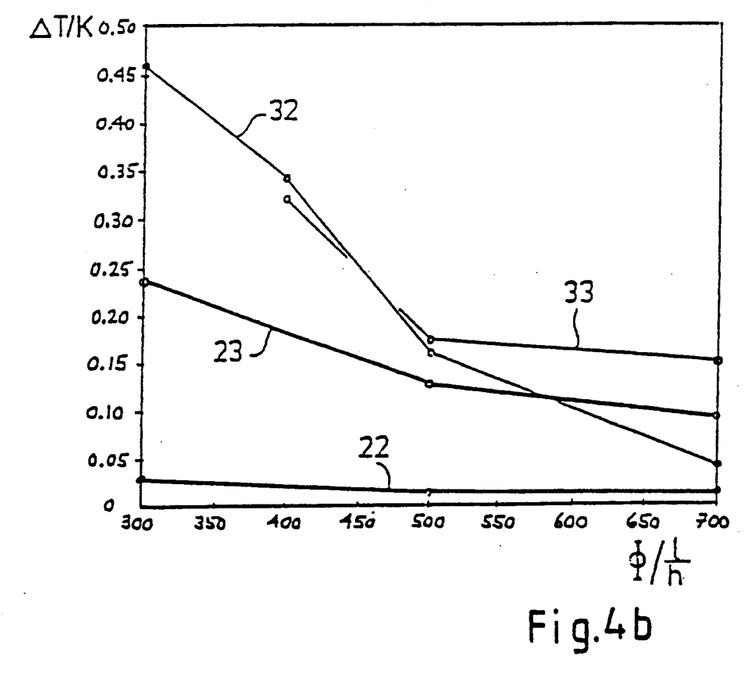
FIG. 4b shows the axial temperature difference in the sample as a function of the total fluid flow, for rotating and non-rotating samples and for the cases of temperature control according to the invention and conventional temperature control according to the countercurrent principle.

FIG. 4 shows the measured properties of the temperature-control device for samples proposed by the invention, by comparison with a conventional temperature-control device operating according to the countercurrent principle, or by comparison with the case of direct temperature control of the sample 1. FIG. 4a shows the recorded heating curve of the sample 1, as a function of time, for the cases of direct temperature control (41), temperature control by means of the temperature-control device for samples (21) according to the invention and temperature control using a conventional temperature-control device for samples operating according to the countercurrent principle (31). It will be readily appreciated that in the case of the temperature control device for samples according to the invention the state of thermal equilibrium of the sample 1 is reached almost as quickly as in the case of the direct temperature control method and that for a given heating capacity and a given fluid flow $\phi$, the final temperature reached with the aid of the temperature-control device for samples according to the invention is only insignificantly lower. In contrast, the final temperature reached with the aid of the temperature-control device for samples operating according to the countercurrent principle is notably lower and is reached later as well. For the purposes of the measurements illustrated in FIG. 4a, the temperature curve over time developing in the sample 1 after connection of a heating capacity of 20 W was recorded for a constant gas flow $\phi=700$ liters/h on a sample 1 having a diameter of 5 mm. FIG. 4b shows the axial temperature difference in the active area of the same 5 mm sample which was used also for the measurements illustrated in FIG. 4a, as a function of the total flow quantity $\phi$ of the gas flowing at any time through the temperature-control device. The mean temperature of the sample 1 was in any case equal to 348 K. The curve 22 was recorded for a temperature-control device for samples according to.the invention with a rotating sample 1, the curve 23 for the same device with a non-rotating sample 1, while the curve 32 was recorded for a conventional temperature-control device for samples operating according to the countercurrent principle and with a rotating sample, and the curve 33 for the same conventional device with a non-rotating sample. The temperature homogeneity inside the sample 1 that can be achieved if the temperature is controlled using the device according to the invention is by far superior to that achieved when the temperature is controlled by means of the conventional device. Especially in the case of rotating samples 1, the temperature difference between the upper and the lower areas of the sample can be reduced with the aid of the temperature-control device according to the invention, as compared to the conventional device, by the tenth power, to values near zero. The use of rotating samples is however standard, especially in NMR spectroscopy.

The reference numerals in the claims are not meant to restrict the invention, but are intended to facilitate its understanding.

What is claimed is:

1. Temperature-control device for NMR spectroscopy, comprising:
   a vessel provided with an opening for receiving a measuring sample, at least one inlet opening for introduction of a temperature controlling fluid into the vessel, and one outlet opening for outflow of the temperature controlling fluid from the vessel;
   flow channel means for separating the temperature controlling fluid into partial flows upon entry into the vessel and for guiding one partial flow of the temperature controlling fluid past the sample as direct fluid flow, from a bottom to a top of the sample; and
   at least one by-pass channel means for guiding another of the partial fluid flows past an upper area of the sample in the form of a by-pass fluid flow.

2. Temperature-control device according to claim 1, wherein a temperature sensor is provided in a lower area of the sample, in the direct fluid flow.

3. Temperature-control device according to claim 2, wherein an additional temperature sensor is provided in the upper area of the sample, in the by-pass fluid flow.

4. Temperature-control device according to claim 1, further comprising means for detecting a lineshape of an NMR signal from the sample and indicating the temperature of the sample at an axial position, based on the line width of the NMR signal.

5. Temperature-control device for NMR spectroscopy comprising:
   a vessel provided with an opening for receiving a measuring sample, two separate inlet openings for introduction of temperature controlling fluids into the vessel and an outlet opening for outflow of the temperature controlling fluids from the vessel;
   flow channel means for guiding one temperature controlling fluid past the sample as direct fluid flow, from a bottom to a top of the sample;
   by-pass channel means for guiding another temperature controlling fluid past an upper area of the sample in the form of a by-pass fluid flow; and
   separate supply lines for connection to the two separate inlet openings to provide the direct fluid flow and the by-pass fluid flow.

6. Temperature-control device according to claim 5, further comprising means for separately controlling the temperature of the direct flow and the by-pass fluid flow.

7. Temperature-control device according to claim 1, further comprising valve means for controlling at least one of the direct fluid flow through the flow channel and the by-pass fluid flow through the by-pass channel.

8. Temperature-control device according to claim 7, further comprising control means for controlling flow rates of the partial flows through the said flow channel and the by-pass channel in such a way that a presettable controlled variable can be kept constant.

9. Temperature-control device according to claim 7, further comprising control, means for controlling temperatures of the partial flows through the said flow channel and the by-pass channel in such a way that a presettable controlled variable can be kept constant.

10. Temperature-control device according to claim 1 further comprising heat-exchanger means disposed in the upper area of the sample for concentrating the direct fluid flow around the sample, after it has been united with the by-pass fluid flow.

11. Temperature-control device according to claim 10, wherein the heat-exchanger means includes a conduit tube enclosing the upper area of the sample over an axial length of exchange, at a small radial spacing, said heat exchanger means further comprising in a lower area thereof, baffle means for deflecting the by-pass fluid flow in a direction toward the sample.

12. Temperature-control device according to claim 10, wherein the heat-exchanger means has a length selected to minimize heat loss from the temperature controlling fluid to the heat-exchanger means, and a small mass, thermal capacity and thermal conductivity relative to the mass, thermal capacity and thermal conductivity of the sample.

13. Temperature-control device according to claim 11, wherein the heat-exchanger means comprises, on an inner surface facing the said sample, a spiral groove extending axially over the axial length of exchange.

14. Temperature-control device according to claim 8, wherein the presettable controlled variable is one of the following variables: the temperature in the lower area of the sample; the temperature in the upper area of the said sample; the temperature difference between the upper and the lower areas of the aid sample; a total fluid flow $\phi$; the partial flow rate of the direct fluid flow; the partial flow rate of the by-pass fluid flow; and a product of at least two of the variables.

15. Temperature-control device according to claim 9, wherein the presettable controlled variable is one of the following variables: the temperature in the lower area of the sample; the temperature in the upper area of the sample; the temperature difference between the upper and the lower areas of the sample; a total fluid flow $\phi$; the partial flow rate of the direct fluid flow; the partial flow rate of the by-pass fluid flow; and a product of at least two of the variables.

* * * * *